(12) United States Patent
Kanehiro et al.

(10) Patent No.: US 10,317,713 B2
(45) Date of Patent: Jun. 11, 2019

(54) METHOD OF PRODUCING DISPLAY PANELS

(71) Applicant: Sharp Kabushiki Kaisha, Sakai, Osaka (JP)

(72) Inventors: Masayuki Kanehiro, Sakai (JP); Youhei Nakanishi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/575,588

(22) PCT Filed: May 20, 2016

(86) PCT No.: PCT/JP2016/065008
§ 371 (c)(1),
(2) Date: Nov. 20, 2017

(87) PCT Pub. No.: WO2016/190240
PCT Pub. Date: Dec. 1, 2016

(65) Prior Publication Data
US 2018/0149906 A1 May 31, 2018

(30) Foreign Application Priority Data
May 27, 2015 (JP) .................................. 2015-107565

(51) Int. Cl.
*G02F 1/1333* (2006.01)
*G04G 9/00* (2006.01)
(Continued)

(52) U.S. Cl.
CPC ..... *G02F 1/133351* (2013.01); *G04G 9/0023* (2013.01); *G09F 9/00* (2013.01);
(Continued)

(58) Field of Classification Search
None
See application file for complete search history.

(56) References Cited

U.S. PATENT DOCUMENTS

2012/0164909 A1* 6/2012 Ohashi .................. G02F 1/1333
445/24
2013/0186853 A1* 7/2013 Sugimoto ......... G02F 1/133351
216/23

FOREIGN PATENT DOCUMENTS

JP 54-1317 A 1/1979
JP 2000075257 A * 3/2000 ............... G02F 1/13
(Continued)

OTHER PUBLICATIONS

Official Communication issued in International Patent Application No. PCT/JP2016/065008, dated Jul. 19, 2016.

*Primary Examiner* — Herve-Louis Y Assouman
(74) *Attorney, Agent, or Firm* — Keating & Bennett, LLP

(57) ABSTRACT

A producing method includes a bonding process of bonding substrates in a pair one of which has thin film patterns and forming a bonded substrate, a cut forming process of forming a cut line CL1 on a border portion between the mounting area within the panel surface area and other area on the one substrate of the bonded substrate, a cutting process of cutting the bonded substrate into separated bonded substrate pieces, a grinding process of grinding the substrates in a pair that are outside the thin film pattern in each of the separated bonded substrates 50A along the outline and forming edge surfaces of the display panels each having the curved outline, and a removing process of cutting a part of the one substrate along the cut line and removing the part.

2 Claims, 13 Drawing Sheets

(51) Int. Cl.
  *G02F 1/1362* (2006.01)
  *H01L 21/20* (2006.01)
  *H01L 21/304* (2006.01)
  *G09F 9/00* (2006.01)
  *G02F 1/1345* (2006.01)
  *G02F 1/1368* (2006.01)

(52) U.S. Cl.
  CPC .......... *G02F 1/1362* (2013.01); *G02F 1/1368* (2013.01); *G02F 1/13452* (2013.01); *G02F 2001/133388* (2013.01); *G02F 2201/56* (2013.01); *G02F 2202/28* (2013.01); *H01L 21/2007* (2013.01); *H01L 21/304* (2013.01)

(56) References Cited

FOREIGN PATENT DOCUMENTS

| | | | | |
|---|---|---|---|---|
| JP | 2006-293045 A | 10/2006 | | |
| JP | 2009-116214 A | 5/2009 | | |
| JP | 2009116214 A | * 5/2009 | .......... | G02F 1/1341 |
| JP | 2015-091610 A | 5/2015 | | |
| WO | 2013/132633 A1 | 9/2013 | | |

\* cited by examiner

METHOD OF PRODUCING DISPLAY PANELS

TECHNICAL FIELD

The present technology relates to a method of producing display panels.

BACKGROUND ART

A display panel such as a liquid crystal panel of a display device including a mounting area in a panel surface area thereof has been known. An IC chip that drives the display panel is mounted in the mounting area. Substrates in a pair one of which includes a thin film pattern of semiconductor elements such as thin film transistors (TFTs) are bonded to each other and a bonded substrate is formed. The bonded substrate includes the mounting area in a part thereof and is cleaved with scribing along an outline of the display panel and thus, and a display panel is produced.

A display panel produced with the above producing method generally has a front view of a square outline or a rectangular outline. Recently, according to variety of usage of the display panels, display panels having a non-rectangular outline such as an outline a part of which is curved have been produced. For example, Patent Document 1 discloses a method of producing a liquid crystal panel including a substantially ellipsoidal display area and, that is, a non-rectangular outline shape.

RELATED ART DOCUMENT

Patent Document

Patent Document 1: Japanese Unexamined Patent Application Publication No. 2006-293045

Problem to be Solved by the Invention

However, in the method of producing liquid crystal panels described in Patent Document 1, mother substrates in a pair including multiple panel areas for the liquid crystal panels are bonded to each other and bonded substrates are cleaved with scribing and cut into pieces for each of the panel areas. For each of the panel areas, the bonded substrates are cleaved with scribing along a slanted cutting line that forms an outline of the liquid crystal panel to be produced and an outline of the liquid crystal panel to be produced is formed. A cutting line for terminal is formed on a portion of one of the substrates corresponding with a terminal portion, that is a mounting area, and the one substrate is cleaved with scribing along the cutting line for terminal such that apart of the one substrate is removed and the terminal portion is formed on the one substrate.

However, in the method of producing the liquid crystal panels described in Patent Document 1, the slanted cutting line intersects with the cutting line for terminal and is extended to an edge surface of the panel area. Therefore, the cut lines with cleaving overlap each other at an intersection point of the slanted cutting line and the cutting line for terminal or an intersection point of the slanted cutting line and the edge surface of the panel area. Uneven stress may act on the intersection points and burrs or chips are likely to be produced near the intersection points. Therefore, it is difficult to produce the liquid crystal panels having a complicated outline with high precision.

DISCLOSURE OF THE PRESENT INVENTION

The present technology was made in view of the above circumstances. An object is to produce display panels each having a mounting area in a part of a panel surface area thereof and having a curved outline with high precision.

Means for Solving the Problem

The technology described in this specification is a method of producing display panels each having an outline a part of which is curved, each of the display panels including a mounting area in a part of a panel surface area thereof, the mounting area in which a driving component for driving the display panel is mounted, and the method includes a bonding process of bonding substrates in a pair one of which has thin film patterns and forming a bonded substrate, a cut forming process of forming a cut line on a border portion between the mounting area within the panel surface area and other area on the one substrate of the bonded substrate, the cut forming process being performed after the bonding process, a cutting process of cutting the bonded substrate into separated bonded substrate pieces after the cut forming process, a grinding process of grinding the substrates in a pair that are outside the thin film pattern in each of the separated bonded substrate pieces along the outline and forming edge surfaces of the display panels each having the curved outline, the grinding process being performed after the cutting process, and a removing process of cutting a part of the one substrate along the cut line and removing the part.

According to the above producing method, the cut line for providing the mounting area on the one substrate is formed in the cut forming process, and the bonded substrate is cut into multiple pieces in the cutting process, and thereafter, in the grinding process, the portions of the substrates in a pair that are outside the thin film patterns on the separated bonded substrate pieces are ground along the outline of the display panels to be produced such that the edge surfaces of the display panels having curved outlines are formed. The cutting lines do not intersect at the intersection points where the outline of the display panel to be produced and the cut line intersect. Therefore, the stress is less likely to act on the intersection points and burrs or chips are less likely to be produced at the portions near the intersection points.

As described before, the outline of the display panel to be produced is not formed by cutting but formed by grinding and therefore, a stress is less likely to act on a part of the outline when forming the outline of the display panel to be produced. Therefore, burrs or chips are less likely to be produced at a part of the outline. Cracks may be produced unintentionally near the edge surface of the display panel, if the edge surface having a curved outline is formed with cutting. In the producing method of this embodiment, the edge surface of the display panel is formed with grinding and therefore, cracks are less likely to be unintentionally produced and the edge surface of the display panel having the curved outline can be formed. As a result, in the producing method of this embodiment, the display panels each including the mounting area in a part of the panel surface area thereof and having the curved outline with high accuracy can be produced.

In the above producing method, in the cut forming process, the cut line may be formed to extend to an edge surface of the one substrate.

In the cut forming process, if the cut line does not reach the edge surface of the one substrate, a stress is concentrated on the portions of the one substrate between the cut line and the edge surface of the one substrate and having no cut lines and burrs or chips may be produced at the portions. In the above producing method, the cut line extends to and reaches the edge surface of the one substrate and therefore, the burrs or chips are less likely to be produced and the display panels can be produced with much higher precision.

The above producing method may further include a layering process of layering the bonded substrates via curing resin and curing the curing resin and forming a layered substrate, the layering process being performed after the cut forming process and before the cutting process, and a separation process of separating each of the bonded substrates included in the layered substrate from the curing resin. In the grinding process, the substrates in a pair and the curing resin that are included in the layered substrate and outside the thin film patterns may be ground collectively along the outline.

According to such a producing method, in the grinding process, the layered substrate including the bonded substrates that are layered on each other is ground. Therefore, the process of producing the display panels is further shortened compared to the method of processing the separated bonded substrates one by one and forming each of the edges of the display panels.

In the above method of producing the display panels, the layered substrate may be cut into separated layered substrate pieces in the cutting process.

Advantageous Effect of the Invention

According to the technology described in this specification, display panels each having a mounting area in a part of a panel surface area thereof and having a curved outline are produced with high precision.

MODES FOR CARRYING OUT THE INVENTION

First Embodiment

Figure 1:
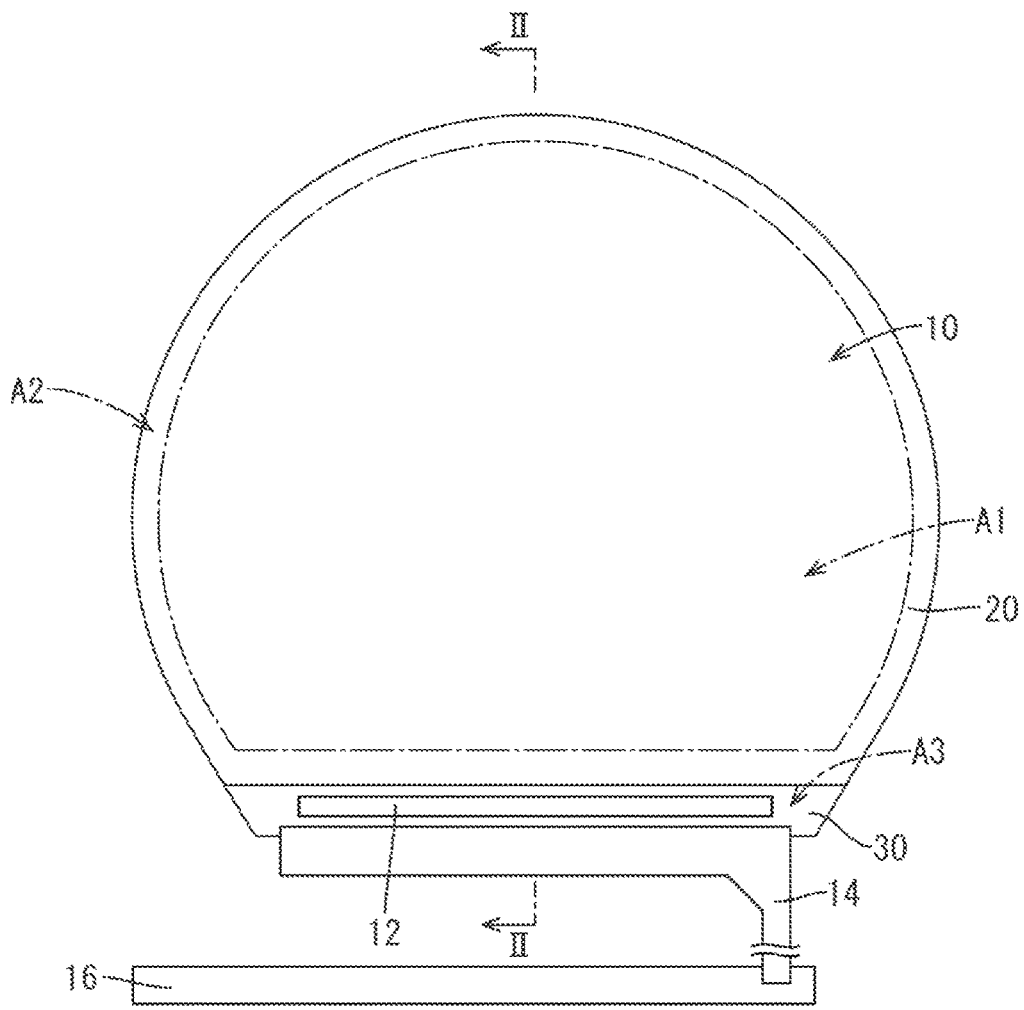
FIG. 1 is a schematic plan view illustrating a liquid crystal panel according to a first embodiment.

A first embodiment will be described with reference to FIGS. 1 to 7. In the present embodiment, a method of producing a liquid crystal panel (an example of a display panel) 10 included in a liquid crystal display device will be described. X-axis, Y-axis and Z-axis may be indicated in the drawings and the axes in each drawing correspond to the respective axes in other drawings. An upper side in FIGS. 2, 4, 5, and 7 corresponds to an upper side (a front side) of the liquid crystal panel 10.

A configuration of the liquid crystal panel 10 will be described. The liquid crystal panel 10 of the present embodiment does not have a general outline plan view shape such as a rectangular shape or a square shape but has an outline of a non-rectangular overall shape. Most of the outline is curved and a part of the outline is straight. Specifically, as illustrated in FIG. 1, the plan view outline shape of the liquid crystal panel 10 is a substantially circular shape. In FIG. 1, the liquid crystal panel 10 has a straight outline extending in the X-axis direction.

The liquid crystal panel 10 includes a laterally elongated display area A1 in most area thereof and images appear on the display area A1. An area of the liquid crystal panel 10 outside the display area A1 is a non-display area A2 in which images are not displayed. The non-display area A2 includes a frame portion surrounding the display area A1 that is a frame portion of the liquid crystal panel 10. The non-display area A2 includes a mounting area A3 in which an IC chip (an example of a driving component) 12 and a flexible printed circuit board 14 are mounted. The mounting area A3 is locally close to one edge portion of the liquid crystal panel 10 with respect to the Y-axis direction (on a lower side in FIG. 1). The IC chip 12 is an electronic component that drives the liquid crystal panel 10 and a control board 16 that supplies various input signals from the outside to the IC chip 12 is connected to the liquid crystal panel 10 via the flexible circuit board 14. As illustrated in FIG. 1, the mounting area A3 included in apart of the panel surface area of the liquid crystal panel 10 is a laterally elongated trapezoidal area. The outline shape of the mounting area A3 has long sides extending linearly along the X-axis and short sides being curved.

Figure 2:
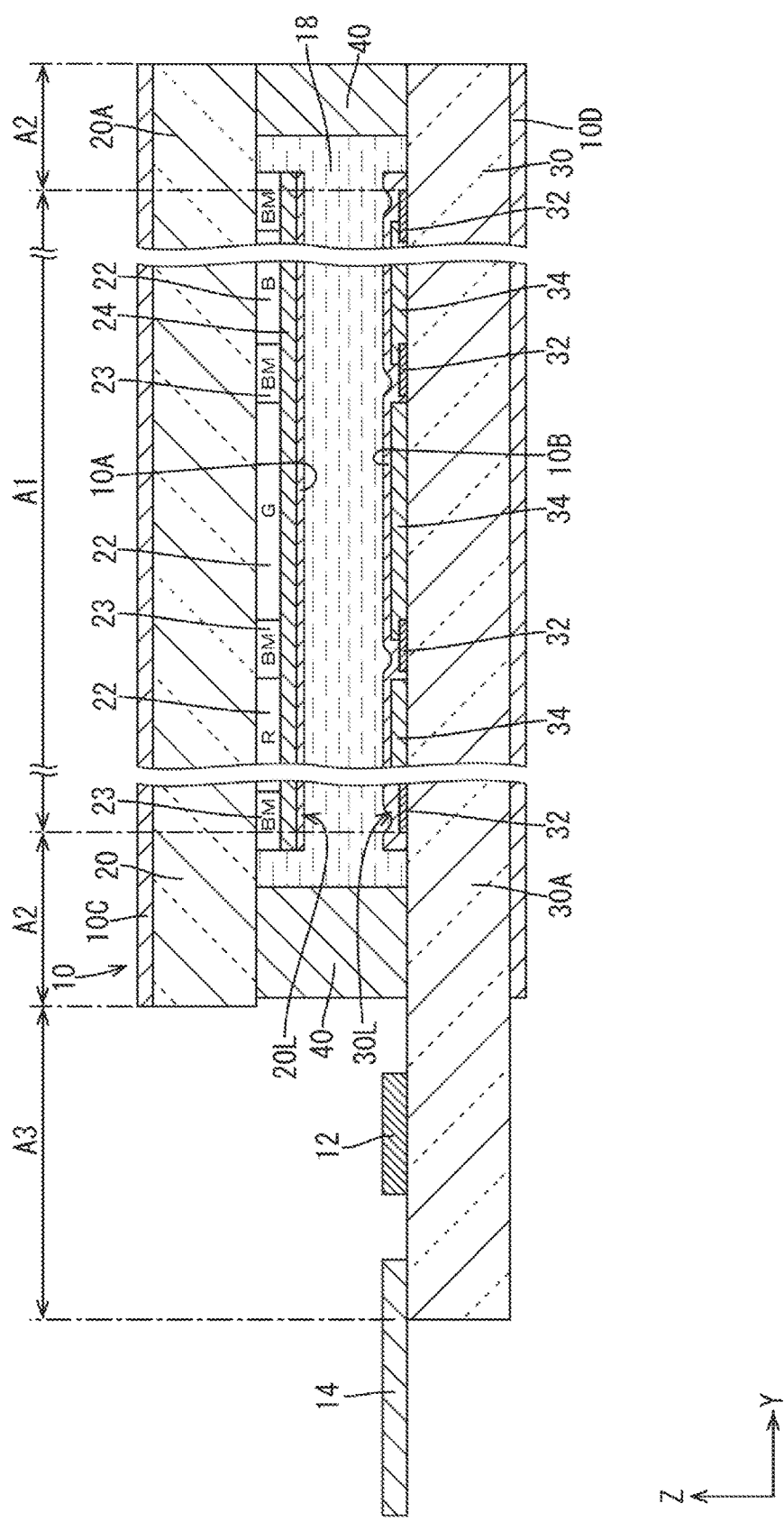
FIG. 2 is a schematic cross-sectional view of the liquid crystal panel illustrating a cross-sectional configuration taken along line II-II in FIG. 1.

As illustrated in FIGS. 1 and 2, the liquid crystal panel 10 includes a pair of glass substrates 20 and 30 having high transmissivity, and a liquid crystal layer 18 including liquid crystal molecules having optical characteristics that vary according to application of electric field. The substrates 20 and 30 of the liquid crystal panel 10 are bonded together with an ultraviolet cure sealing agent portion 40 with a cell gap of a thickness of the liquid crystal layer 18 therebetween. The liquid crystal layer 18 is inside the sealing agent portion 40. The substrates 20 and 30 of the liquid crystal panel 10 include a color filter substrate 20 on the front (on a front surface side) and an array substrate 30 on a back side (on a rear surface side). Alignment films 10A and 10B are formed on inner surfaces of the substrates 20 and 30, respectively, for aligning the liquid crystal molecules included in the liquid crystal layer 18. Polarizing plates 10C and 10D are bonded to outer surfaces of a first glass substrate (one example of substrates) and a second glass substrate (one example of the substrates) of the substrates 20, 30, respectively.

The array substrate 30 and the polarizing plate 10C are bonded to a main portion of the first glass substrate 20A of the color filter substrate 20. As illustrated in FIG. 1, the color filter substrate 20 has an X-axis dimension substantially same as that of the array substrate 30 and has a Y-axis dimension smaller than that of the array substrate 30. The color filter substrate 20 and the array substrate 30 are bonded together such that respective ones of the Y-axis edges (upper-side edges in FIG. 1) thereof are aligned with each other. According to such a configuration, the color filter substrate 20 is not overlapped with a portion of the array substrate 30 in another one of the Y-axis edges (a lower-side edge in FIG. 1) over a certain area and the edge portion of the array substrate 30 is exposed outside on the front and rear plate surfaces thereof. Thus, a mounting area A3 where the IC chip 12 and the flexible printed circuit board 14 are mounted is provided in the exposed portion.

The color filter substrate 20 and the polarizing plate 10D are bonded to a main portion of the second glass substrate 30A of the array substrate 30 and a portion of the array substrate 30 for the mounting area A3 where the IC chip 12 and the flexible printed circuit board 14 are mounted is not overlapped with the color filter substrate 20 and the polarizing plate 10D. The sealing agent portion 40 for bonding the substrates 20 and 30 of the liquid crystal panel 10 is disposed within the non-display area A2 of an overlapped portion where the substrates 20 and 30 are overlapped with each other. The sealing agent portion 40 is disposed to surround the display area A1 along the outline of the color filter substrate 20 (be in a substantially circular plan view form) (see FIG. 2).

Layered thin film patterns are formed on the inner surface side (the liquid crystal layer 18 side) of the second glass substrate 30A of the array substrate 30. Specifically, the thin film patterns of TFTs 32 that are switching components and thin film patterns of pixel electrodes 34 that are transparent conductive films such as indium tin oxide (ITO) and connected to the TFTs 32 are arranged in a matrix on the inner surface of the second glass substrate 30A of the array substrate 30. Furthermore, gate lines, source lines and capacitance lines (not illustrated) are arranged to surround the TFTs 32 and the pixel electrodes 34 on the array substrate 30. Terminals extended from each of the gate lines and the capacitance lines and terminals extended from the source lines are connected to the edge portion of the array substrate 30. Signals or reference potential is input from a control board 16 illustrated in FIG. 1 to each of the terminals and driving of the TFTs 32 is controlled.

As illustrated in FIG. 2, color filters 22 are arranged on the inner surface side (the liquid crystal layer 18 side) of the first glass substrate 20A of the color filter substrate 20. The color filters 22 are arranged in a matrix while overlapping the respective pixel electrodes 34 of the array substrate 30 in a plan view. The color filters 22 include red (R), green (G), and blue (B) color portions. A light blocking portion (black matrix) 23 is formed between the color portions included in the color filters 22 for reducing color mixture. The light blocking portion 23 is arranged to overlap the gate line, the source lines, and the capacitance lines in a plan view.

In the liquid crystal panel 10, the R (red) color portion, the G (green) color portion, the B (blue) color portion, and three pixel electrodes 34 opposed to the respective color portions form a display pixel that is a display unit. Each display pixel includes a red pixel including the R color portion, a green pixel including the G color portion, and a blue pixel including the B color portion. The color pixels are repeatedly arranged along a row direction (the X-axis direction) on a plate surface of the liquid crystal panel 10 to form a pixel group. The pixel groups are arranged along the column direction (the Y-axis direction).

As illustrated in FIG. 2, a counter electrode 24 is disposed on inner surfaces of the color filter 22 and the light blocking portion 23 to be opposed to the pixel electrodes 34 on the array substrate 30 side. Counter electrode lines, which are not illustrated, are arranged in the non-display area of the liquid crystal panel 10. The counter electrode lines are connected to the counter electrode 24 via a contact hole. Reference potential is applied to the counter electrode 24 from the counter electrode lines and the potential to be applied to the pixel electrodes 34 is controlled by the TFTs 32 to produce potential difference between the pixel electrodes 34 and the counter electrode 24.

As illustrated in FIG. 2, on an edge surface of the liquid crystal panel 10 of this embodiment having a linear outline (a left side edge surface in FIG. 2, hereinafter referred to as a linear edge surface), the pair of glass substrates 20A, 30A extends slightly further toward outside the sealing agent portion 40. On the edge surface (an edge surface on the right side in FIG. 2, hereinafter referred to as a curved edge surface) having a curved outline shape, the edge surfaces of the glass substrates 20A and 30A are aligned with an edge surface of the sealing agent portion 40. As illustrated in FIG. 2, a width dimension of the sealing agent portion 40 on the curved edge surface (a Y-axis dimension) is smaller than a width dimension of the sealing agent portion 40 on the linear edge surface. Accordingly, a frame having a small width dimension is achieved.

The liquid crystal panel 10 has the above-described configuration and a method of producing multiple liquid crystal panels 10 including the mounting area A3 in a part of the panel surface area thereof will be described next. Hereinafter, the configuration formed on the first glass substrate 20A except for the alignment film 10A is referred to as a CF layer (an example of a thin film pattern) 20L and the configuration formed on the second glass substrate 30A except for the alignment film 10B is referred to as a TFT layer (an example of a thin film pattern) 30L.

In the process of producing the liquid crystal panel 10 according to this embodiment, the first glass substrate 20A to be the color filter 20 and the second glass substrate 30A to be the array substrate 30 are prepared. The CF layer 20L is formed on one plate surface of the first glass substrate 20A and the TFT layer 30L is formed on one plate surface of the second glass substrate 30A. The CF layer 20L and the TFT layer 30L are formed on the first glass substrate 20A and the second glass substrate 30A, respectively, with a known photolithography method. The first glass substrate 20A and the second glass substrate 30A are transferred through a film forming device, a resist coating device, and an exposure device used with the photolithography method such that thin films for the CF layer 20L and the TFT layer 30L are layered sequentially in a predefined pattern.

In the producing method according to this embodiment, a bonded substrate 50 obtained by bonding the first glass substrate 20A and the second glass substrate 30A is cut to obtain small pieces in processes described below. Thus, twenty four liquid crystal panels 10 are produced from one bonded substrate 50 (a mother board). The CF layer 20L is formed on each of twenty four portions of the first glass substrate 20A and the TFT layer 30L is formed on each of twenty four portions of the second glass substrate 30A (see FIG. 3). The CF layers 20L and the TFT layers 30L are formed in a matrix on the respective glass substrates 20A and 30A (four in the X-axis direction and six in the Y-axis direction in this embodiment) such that each of the CF layers 20L and each of the TFT layers 30L are opposite each other when bonding the glass substrates 20A and 30A.

Figure 3:
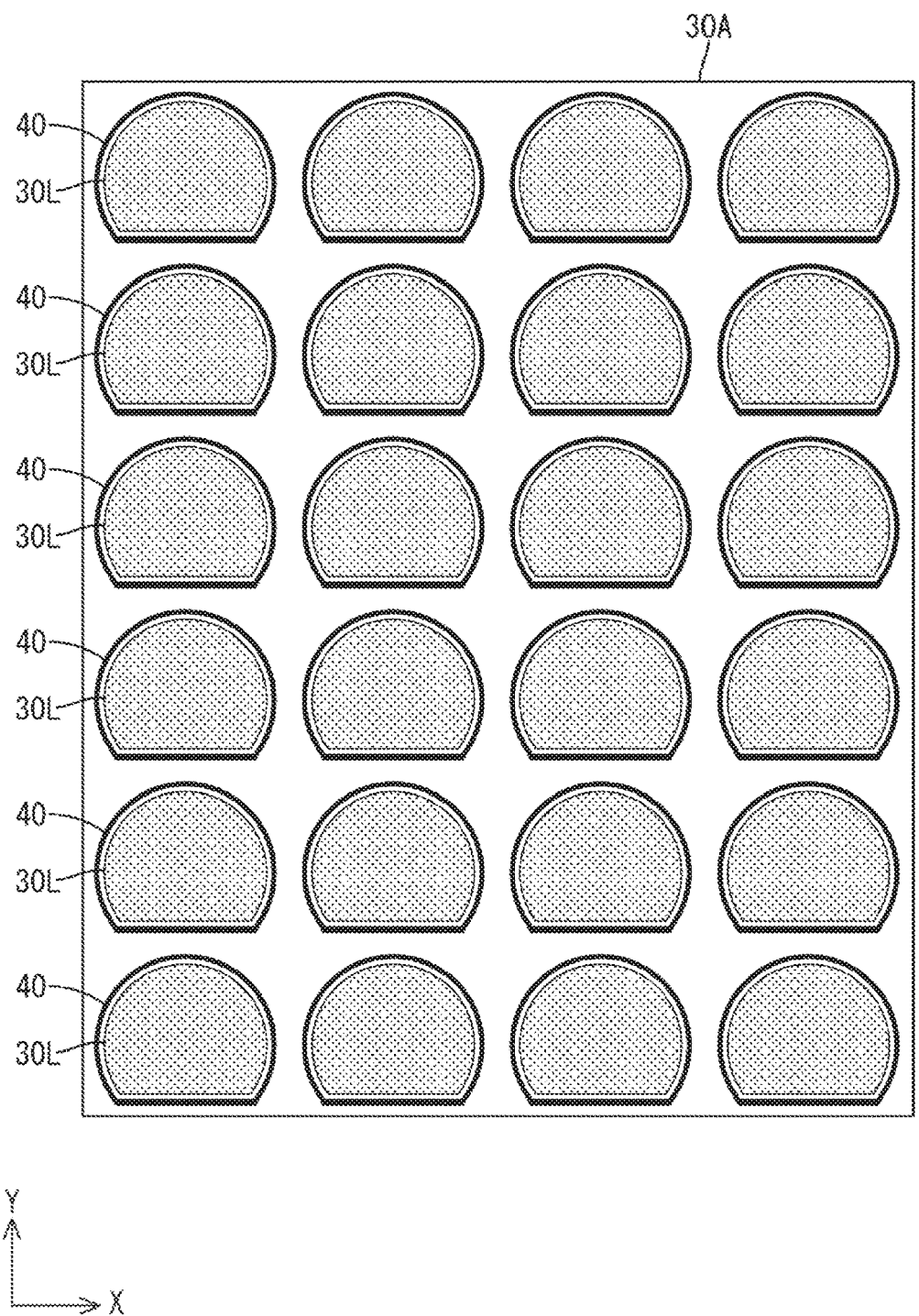
FIG. 3 is a plan view illustrating a bonding process.

Next, the alignment film 10A is disposed on the first glass substrate 20A and covers each of the CF layers 20L formed on the first glass substrate 20A, and the alignment film 10B is disposed on the second glass substrate 30A and covers each of the TFT layers 30L formed on the second glass substrate 30A. According to the above sequence, twenty four color filter substrates 20 are formed on the first glass substrate 20A and twenty four array substrates 30 are formed on the second glass substrate 30A. Next, the sealing agent portions 40 are disposed on the second glass substrate 30A to surround each of the TFT layers 30L on the second glass substrate 30A (see FIG. 3). In this process, as illustrated in FIG. 3, the sealing agent portion 40 is disposed along the outline (substantially a circular shape in this embodiment) of each of the liquid crystal panels 10 to be produced and disposed over a predefined width.

Figure 4:
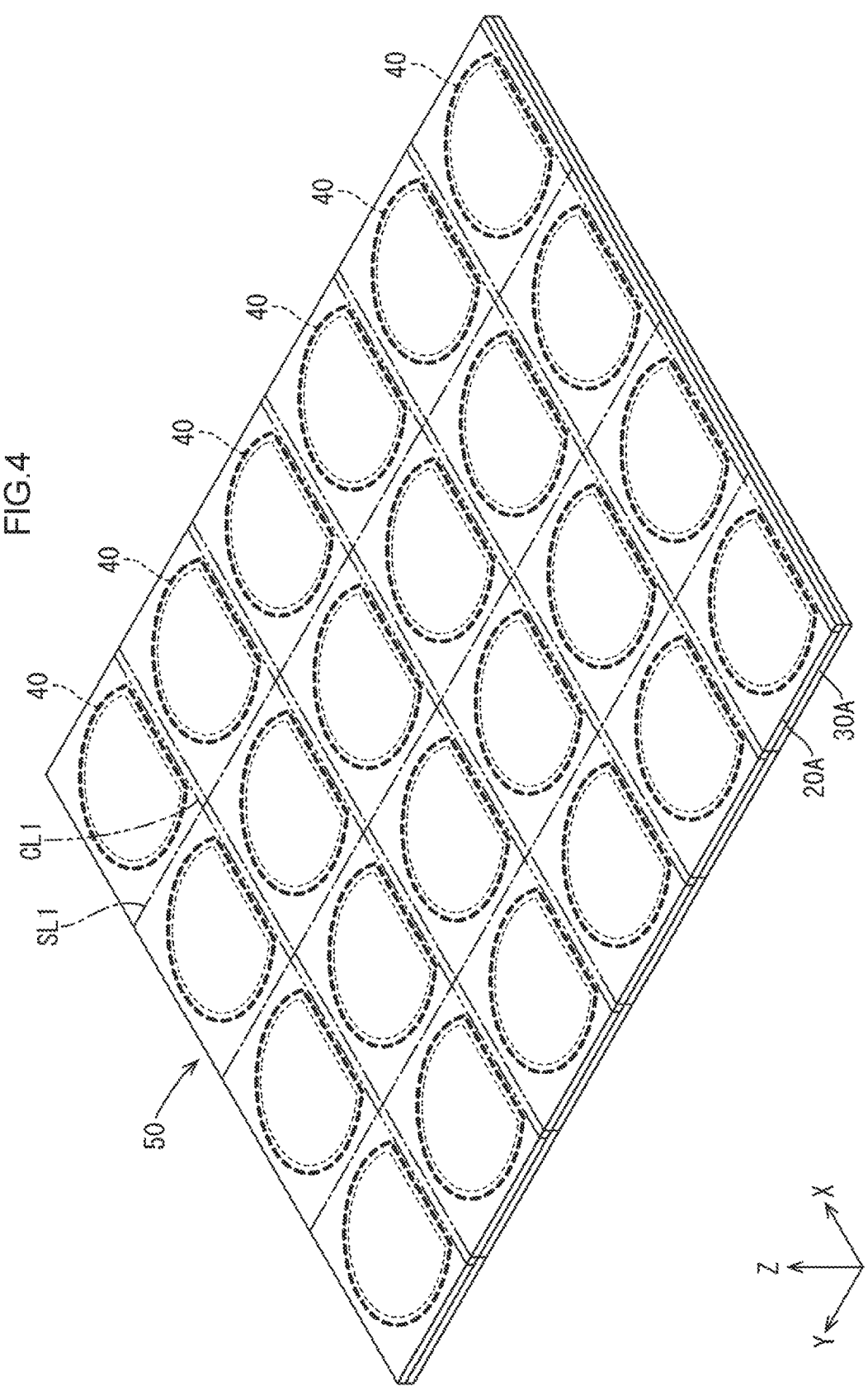
FIG. 4 is a perspective view illustrating a separated bonded substrate before a cut forming process and a cutting process.

Next, the first glass substrate 20A and the second glass substrate 30A are positioned with each other such that the CF layers 20L formed on the first glass substrate 20A are opposite the TFT layers 30L formed on the second glass substrate 30A, respectively. Liquid crystals are dripped in areas surrounded by the sealing agent portions 40 on the second glass substrate 30A with the one drop fill (ODF) method using a liquid crystals dripping device. Then, the glass substrates 20A and 30A are bonded with the sealing agent portions 40 and the bonded substrate 50 is obtained as illustrated in FIG. 4 (a bonding process). The bonding process is performed while the sealing agent portions 40 are irradiated with ultraviolet rays and heated. Accordingly, the sealing agent portions 40 are cured and the glass substrates 20A and 30A are fixed to each other with the sealing agent portions 40.

In the bonding process, by the bonding of the glass substrates 20A and 30A, the liquid crystals dripped before the bonding of the glass substrates 20A and 30A spread along a plate surface of the second glass substrate 30A and the areas surrounded by the sealing agent portions 40 are filled with the liquid crystals. Thus, the liquid crystal layers 18 are formed between the glass substrates 20A and 30A. The bonded substrate 50, which is obtained as described before, includes areas where the CF layers 20 and the TFT layers 30L that are opposite each other and each of the areas including opposing CF layer 20 and TFT layer 30L is a panel region that forms one liquid crystal panel 10. As illustrated in FIG. 4, the bonded substrate 50 is defined into twenty four panel regions. Dot-and-dash lines in FIG. 4 illustrate lines defining the panel regions on the bonded substrate 50. The cured sealing agent portion 40 and a thin film pattern (a portion inside the sealing agent portion 40 and surrounded by a thin dotted line in FIG. 4) that is arranged within the sealing agent portion 40 and includes the CF layer 20L and the TFT layer 30L are included in each panel region.

Next, linear cut lines CL1 (illustrated with two-dot chain lines in FIG. 4) are formed on the first glass substrate 20A of the bonded substrate 50 at a border portion between the mounting areas A3 of the liquid crystal panels 10 to be produced and other areas, and the linear cut lines CL1 are formed with scribing using a scribing wheel (a cut forming process). In the cut forming process, as illustrated in FIG. 4, each of the cut lines CL1 extends over the multiple panel regions (four panel regions in this embodiment) and extends from one edge surface to another edge surface of the first glass substrate 20A. In the cut forming process, the cut lines CL1 are formed on the first glass substrate 20A but a part of the first glass substrate 20A is not cut away along the cut line CL1.

Next, the bonded substrate 50 is cut into twenty four pieces for each of the panel regions (a cutting process). Specifically, in the process, the bonded substrate 50 is cut into the pieces along cutting lines SL1 that define the panel regions of the bonded substrate 50 with scribing using a scribing wheel or with dicing using a dicing saw. Accordingly, the glass substrates 20A and 30A that are outside the sealing agent portion 40 in each of the panel regions are cut and the bonded substrate 50 is cut into twenty four pieces. Hereinafter, separated bonded substrate pieces obtained in the cutting process are referred to as separated bonded substrates 50A.

Figure 5:
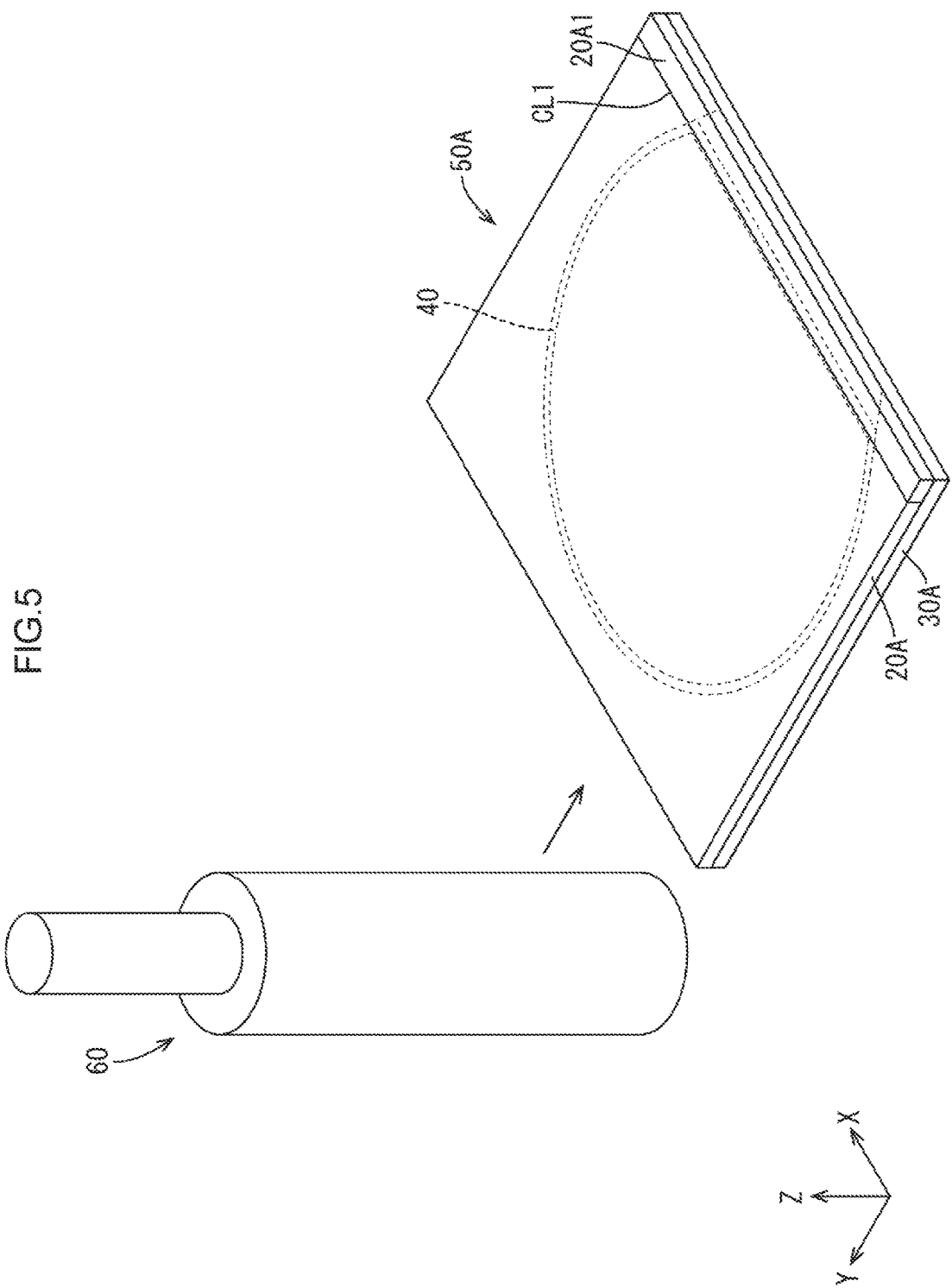
FIG. 5 is a perspective view illustrating a separated bonded substrate before a grinding process.
Figure 6:
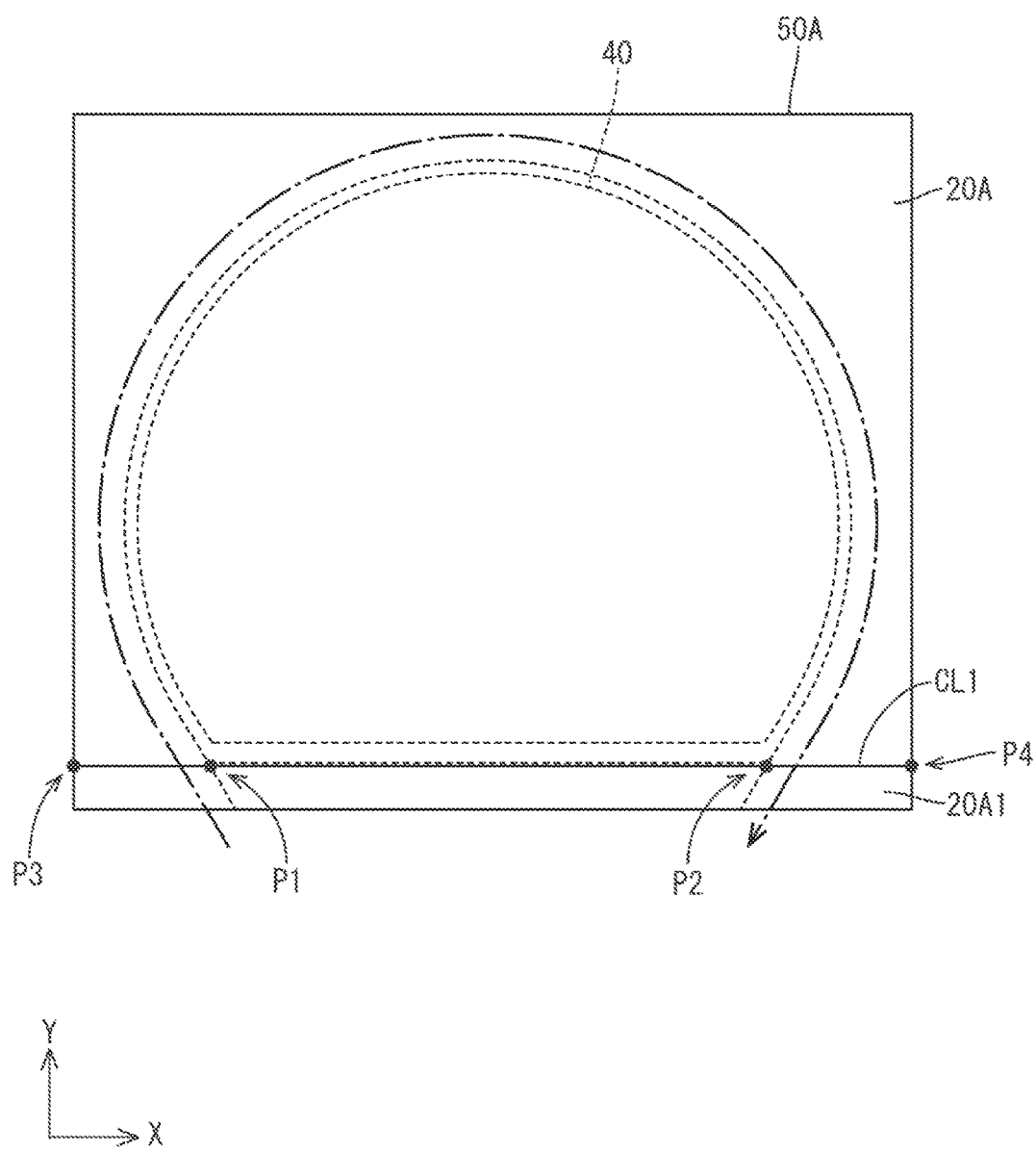
FIG. 6 is a plan view illustrating a portion of the separated bonded substrate that is to be ground in the grinding process.

Next, as illustrated in FIGS. 5 and 6, the curved edge surface of each liquid crystal panel 10 is ground with a grinder 60 (a grinding process). The grinder 60 is a device of rotating a grinding wheel for grinding an object to be processed. The linear edge surfaces of the liquid crystal panels 10 to be produced are not ground. In FIGS. 5 and 6, one separated bonded substrate 50A is illustrated and an arrow illustrated with a dot-and-dash line in FIG. 6 illustrates a moving direction in which the grinder 60 is moved with respect to the separated bonded substrate 50A in the grinding process. In the grinding process, portions of the glass substrates 20A and 30A that are outside the thin film patterns of each of the separated bonded substrates 50A are ground along the outlines of the curved edge surfaces of the liquid crystal panels 10 to be produced (see FIG. 6).

Specifically, in the grinding process, after the grinder 60 is moved and reaches a pair of glass substrates 20A, 30A and the sealing agent portion 40 that are overlapped with each other in a plan view, the pair of glass substrates 20A, 30A and the sealing agent portion 40 are ground along the outline of the curved edge surface of the liquid crystal panel 10 to be produced such that grinding surfaces of the glass substrates 20A, 30A and the grinding surface of the sealing agent portion 40 are aligned with each other. Accordingly, an outline shape of the liquid crystal panel 10 to be produced is formed. Hereinafter, the separated bonded substrate 50A after the grinding process is referred to as a ground bonded substrate 50B (see FIG. 7).

In FIG. 6, intersection points P1, P2 are intersection points of processed edge surfaces of the glass substrates 20A, 30A and the sealing agent portion 40 that are subjected to the grinding process and the cut line CL1 of the first glass substrate 20A. If the separated bonded substrate 50A is cleaved with scribing along the outline of the curved edge surface of the liquid crystal panel 10 to be produced to form the outline of the liquid crystal panel 10 to be produced, uneven stress acts on the intersection points P1 and P2 and burrs or chips are likely to be produced near the intersection points P1 and P2. If the separated bonded substrate 50A is scribed into a substantially circular form continuously along the outline of the curved edge surface of the liquid crystal panel 10 to be produced and the portion where a cut line is to be formed without performing the cut forming process, burrs or chips are likely to be produced in a portion where a start point and an end point of scribing are close to each other.

Figure 7:
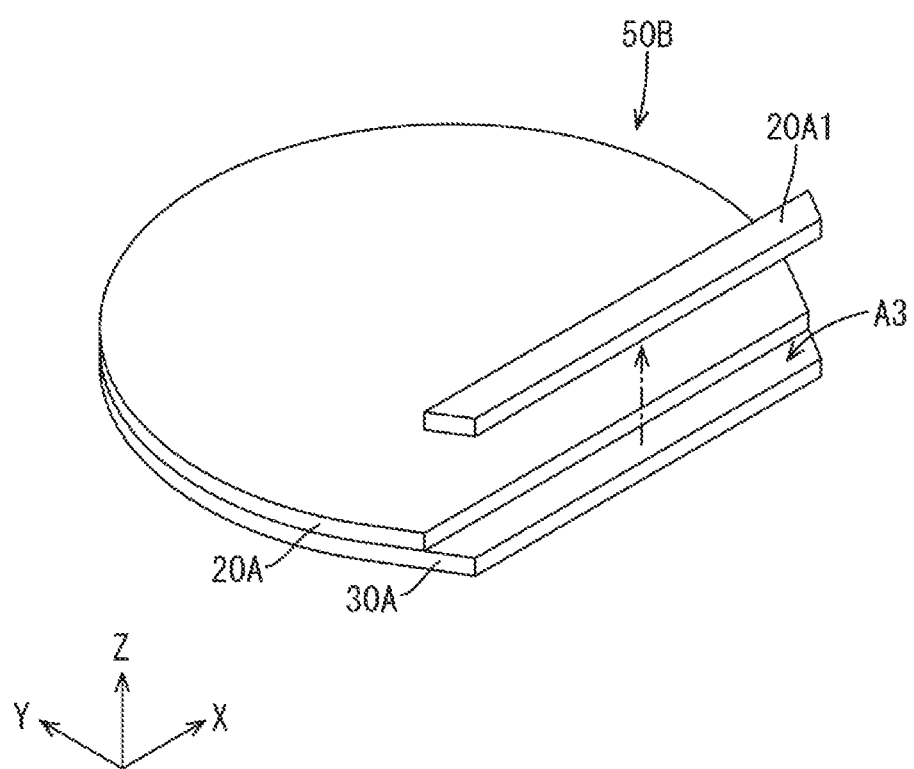
FIG. 7 is a perspective view illustrating a removing process.

In the producing method of this embodiment, in the grinding process, the curved edge surface is processed by grinding with the grinder 60 along the outline of the liquid crystal panel 10 to be produced. Therefore, uneven stress is not applied to the portions of the separated bonded substrate 50A near the intersections P1 and P2 and other portions thereof. Burrs or chips are less likely to be unintentionally produced near the curved edge surface compared to the curved edge surface that is processed with scribing. Therefore, as illustrated in FIG. 7, by performing the grinding process, the ground bonded substrate 50B having the curved edge surface that is processed with high precision can be formed. The bonded substrate 50 illustrated in FIG. 4 may be ground along the outline of the curved edge surface of each of the liquid crystal panels 10 to be produced without performing the cutting process. In such a method, the grinding process includes the cutting process.

The method of producing the liquid crystal panels 10 according to this embodiment will be described. After the grinding process, as illustrated in FIG. 7, an edge portion 20A1 of the first glass substrate 20A is cut away along the cut line CL1 and removed from each ground bonded substrate 50B (a removing process). Accordingly, the mounting area A3 of the liquid crystal panel 10 to be produced is exposed (see FIG. 7). Then, the polarizing plates 10C, 10D are bonded to the outer surfaces of the glass substrates 20A and 30A included in each ground bonded substrate 50B having the mounting area A3 that is uncovered, and the IC chip 12 is mounted on each of the mounting areas A3 such that twenty four liquid crystal panels 10 according to this embodiment are obtained.

Intersection points P3, P4 in FIG. 6 are intersection points of the cut line CL1 formed in the first glass substrate 20A and edge surfaces of the separated bonded substrate 50A that is cut and separated in the cutting process. The cutting lines for cleaving intersect at the intersection points P3, P4 and the removing process is performed after the grinding process and the portions including the intersection points P3, P4 are ground in the grinding process. Therefore, the portions including the intersection points P3, P4 are already ground when a part of the first glass substrate 20A is cut and removed in the removing process. During the process of producing the liquid crystal panels 10 according to this embodiment, burrs or chips are less likely to be produced at the portions near the intersection points P3, P4.

As described before, in the producing method of this embodiment, the cut lines CL1 for providing the mounting areas A3 on the first glass substrate 20A are formed in the cut forming process, and the bonded substrate 50 is cut into multiple pieces in the cutting process, and thereafter, in the grinding process, the portions of the glass substrates 20A, 30A that are outside the thin film patterns on the separated bonded substrates 50A are ground along the outlines of the display panels 10 to be produced such that the edge surfaces of the liquid crystal panels 10 having curved outlines are formed. The cutting lines do not intersect at the intersection points P1, P2 where the outline of the liquid crystal panel 10 to be produced and the cut line CL1 intersect. Therefore, the stress is less likely to act on the intersection points P1, P2 and burrs or chips are less likely to be produced at the portions near the intersection points P1, P2.

As described before, the outline of the liquid crystal panel 10 to be produced is not formed by cutting but formed by grinding and therefore, a stress is less likely to act on a part of the outline when forming the outline of the liquid crystal panel 10 to be produced. Therefore, burrs or chips are less likely to be produced at a part of the outline. In the producing method of this embodiment, the edge surface of the liquid crystal panel 10 is formed with grinding and therefore, cracks are less likely to be unintentionally produced and the edge surface of the liquid crystal panel 10 having the curved outline can be formed. As a result, in the producing method of this embodiment, the liquid crystal panels 10 each including the mounting area A3 in a part of the panel surface area thereof and having the curved outline with high accuracy can be produced.

In the producing method of this embodiment, in the cut forming process, the cut lines CL1 are formed to extend to the edge surface of the first glass substrate 20A. In the cut forming process, if the cut line CL1 does not reach the edge surface of the first glass substrate 20A, a stress is concentrated on the portions of the first glass substrate 20A between the cut line CL1 and the edge surface of the first glass substrate 20A and having no cut lines CL1 and burrs or chips may be produced at the portions. In the producing method of this embodiment, the cut line CL1 extends to and reaches the edge surface of the first glass substrate 20A and therefore, the burrs or chips are less likely to be produced and the liquid crystal panels 10 can be produced with much higher precision.

A cutting technology with laser scribing has been known as a method of cutting a glass substrate. If a cut line is formed with laser scribing in the cut forming process, a light blocking film is necessary to be formed on an inner surface of a portion of the first glass substrate where the cut line is to be formed to protect the mounting area that is to be formed on the second glass substrate from laser. Therefore, a process of forming the light blocking film and a process of removing the light blocking film are necessary and this may increase a tact time and lower production yield in the production process of the liquid crystal panels. In this embodiment, scribing is not performed with laser scribing but with using a scribing wheel and therefore, the above-described problems are less likely to be caused.

The liquid crystal panels 10 produced with the producing method of this embodiment have edge surfaces including a frosted glass surface at a portion subjected to the grinding process and a mirror surface at a portion subjected to cutting with scribing, and a scribing trace remains on the mirror surface. Therefore, the liquid crystal panel 10 produced in the producing method of this embodiment includes an edge surface having different conditions.

Second Embodiment

Figure 8:
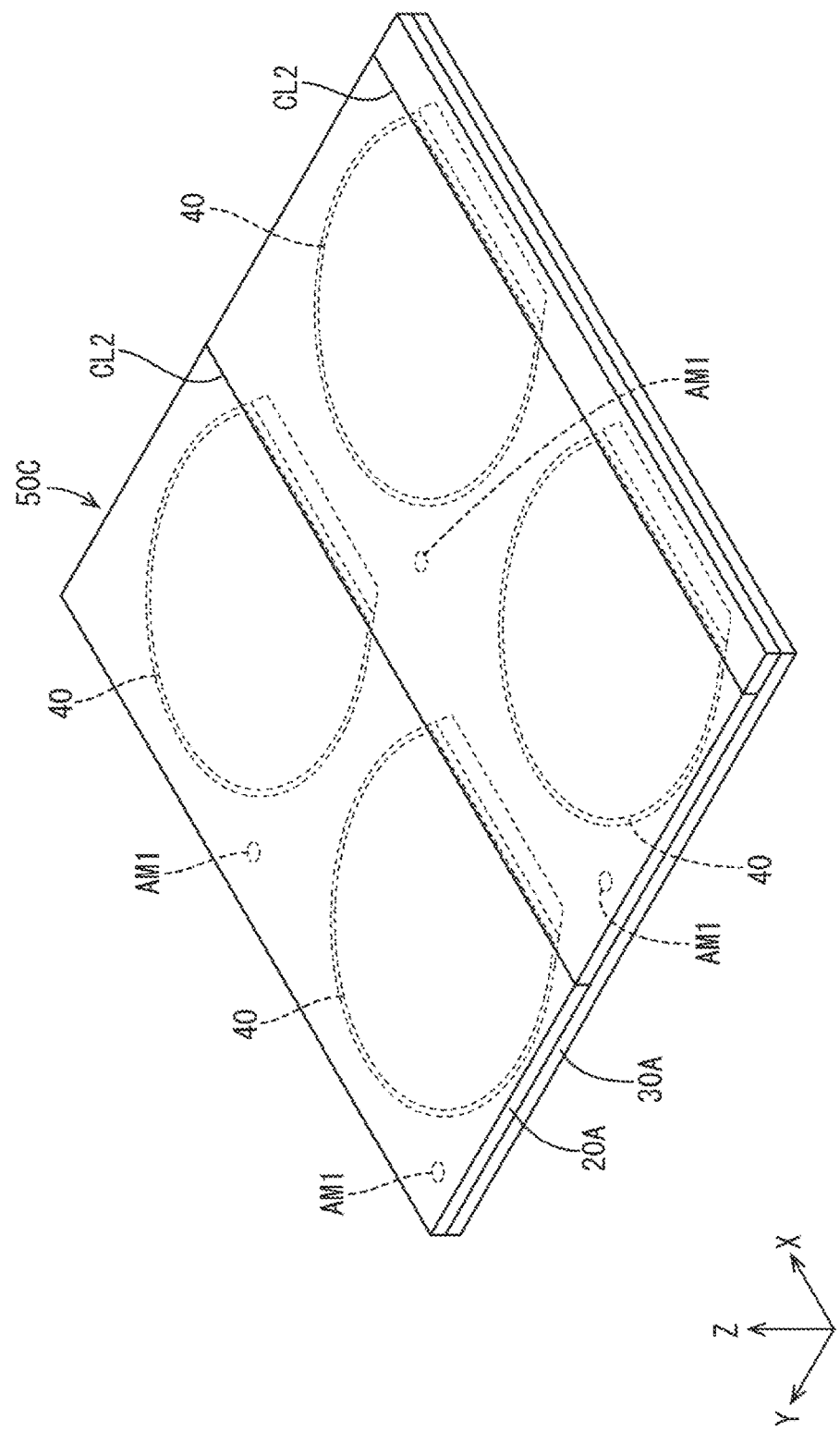
FIG. 8 is a perspective view illustrating a bonded substrate according to a second embodiment.

A second embodiment will be described with reference to FIGS. 8 to 13. In the second embodiment, a producing process is shortened compared to the method of producing the liquid crystal panel 10 of the first embodiment. In the producing method of this embodiment, as illustrated in FIG. 8, in the cutting process, the bonded substrate 50 is cut into pieces such that a separated bonded substrate 50C includes four panel regions of two in the lateral direction (the X-axis direction) and two in the vertical direction (the Y-axis direction). A line CL2 in FIG. 8 is a cut line formed in the first glass substrate 20A in the cut forming process.

Figure 9:
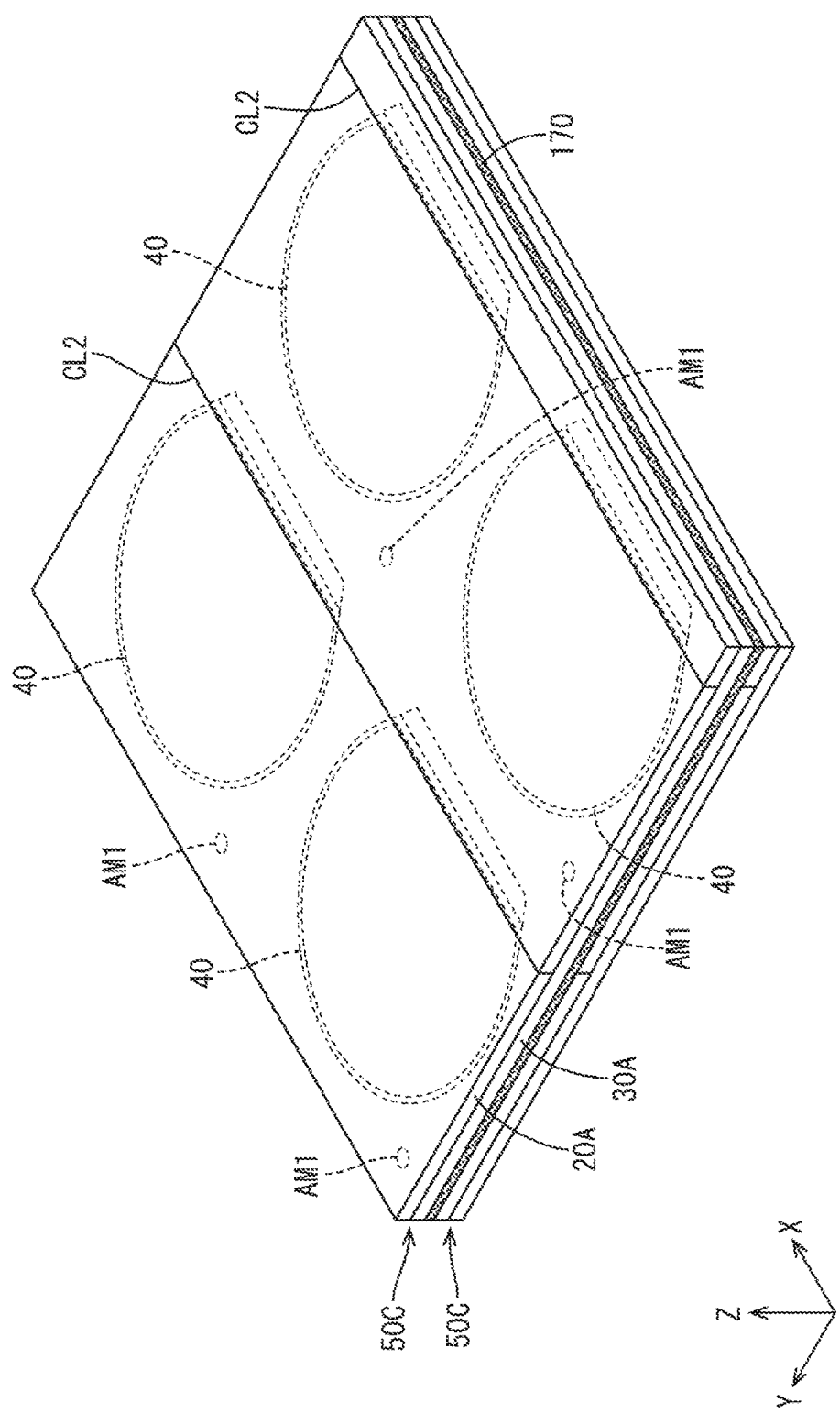
FIG. 9 is a perspective view illustrating a layering process (1).
Figure 10:
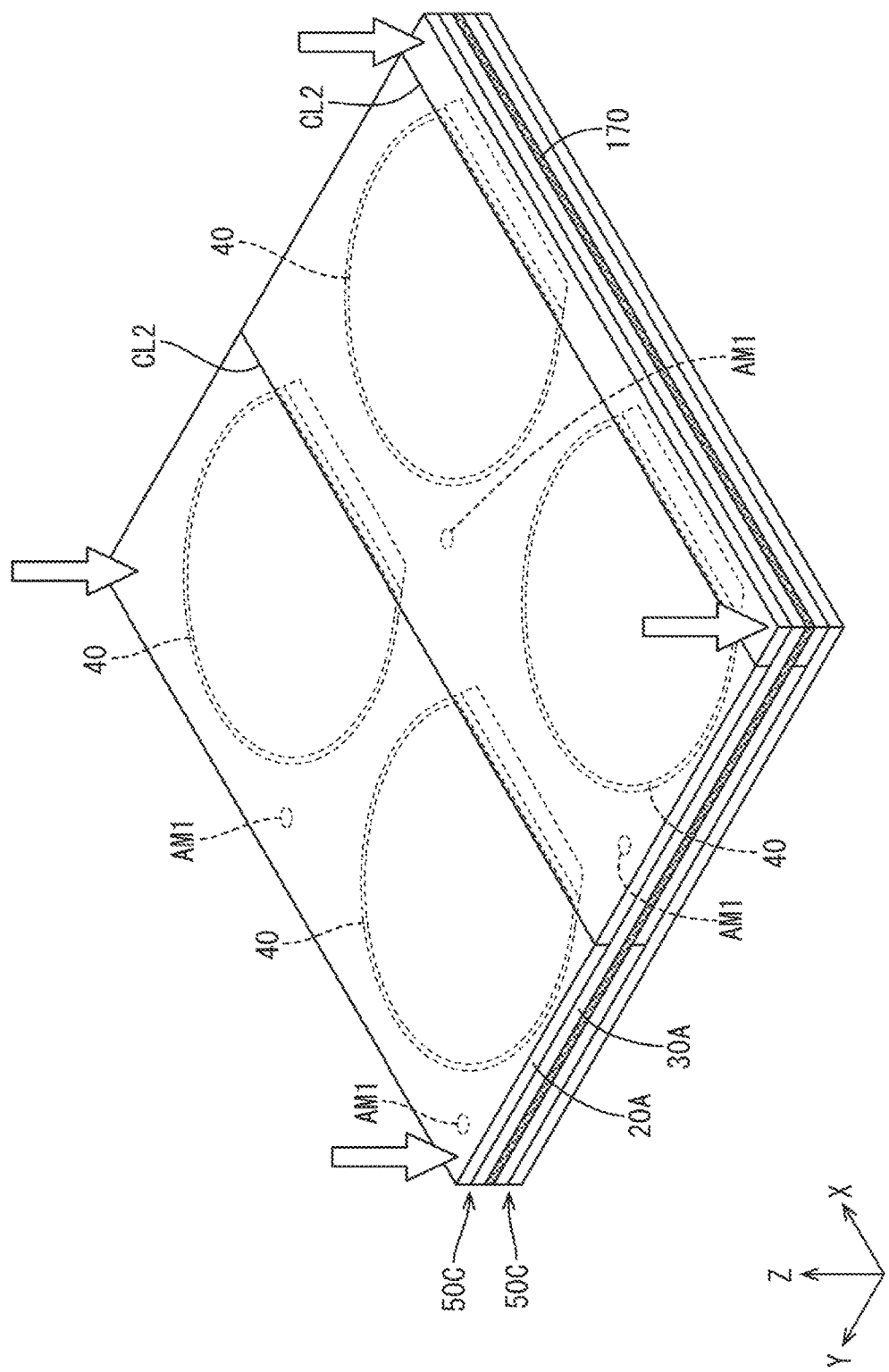
FIG. 10 is a perspective view illustrating a layering process (2).

In the producing method of this embodiment, as illustrated in FIG. 9, after the cutting process, two separated bonded substrates 50C are layered on and overlapped with each other in a plan view while having curing resin 170 therebetween and being positioned with each other using alignment marks AM1 formed in the separated bonded substrates 50C (a layering process). The curing resin 170 used in the layering process is two-part liquid resin including two kinds of liquid resin that are to be mixed and cured. The two-part liquid resin of the curing resin 170 preferably includes one resin containing organic peroxide and another resin containing a decomposition promoter. At least one of the resins preferably contains photopolymerization initiator that is cured by ultraviolet rays. Specific components and a use amount of the organic peroxide, specific components and a use amount of the decomposition promoter, and specific components and a use amount of the photopolymerization initiator are described in Japanese Translation of PCT international Application Publication No. 2013/011969. For reference, the entire contents in Japanese Translation of PCT International Application Publication No. 2013/011969 are incorporated herein by reference.

In the layering process, after the two separated bonded substrates 50C are layered, pressure is applied to an upper one of the separated bonded substrates 50C such that bubbles are removed from the curing resin 170 and extra resin is pushed out. Thus, a distance between the two separated bonded substrates 50C is substantially constant. Then, the two separated bonded substrates 50C are positioned with each other with using a positioning camera. In the layering process, if the curing resin 170 containing the photopolymerization initiator is used, every time another separated bonded substrate 50C is layered on the separated bonded substrate 50C, the separated bonded substrates 50C are irradiated with a predefined amount (for example from 50 to 500 mJ/cm$^2$) of ultraviolet rays at four corners of the separated bonded substrates 50C in a plan view to cure the curing resin 170 at the four corners (refer arrows in FIG. 10). The four corners of the layered two separated bonded substrates 50C are outside the sealing agent portions 40 that surround the respective thin film patterns.

Figure 11:
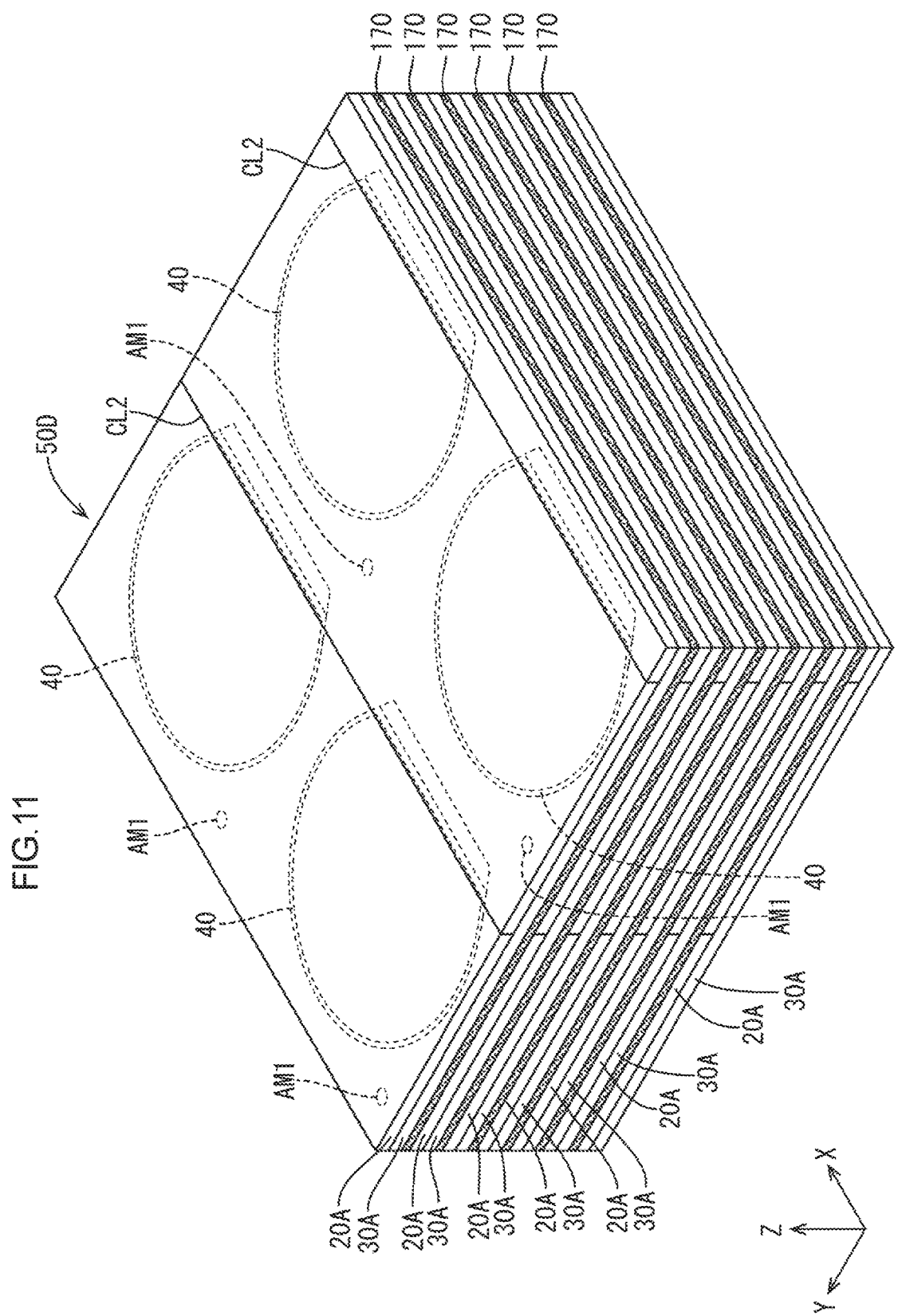
FIG. 11 is a perspective view illustrating a layered substrate.
Figure 12:
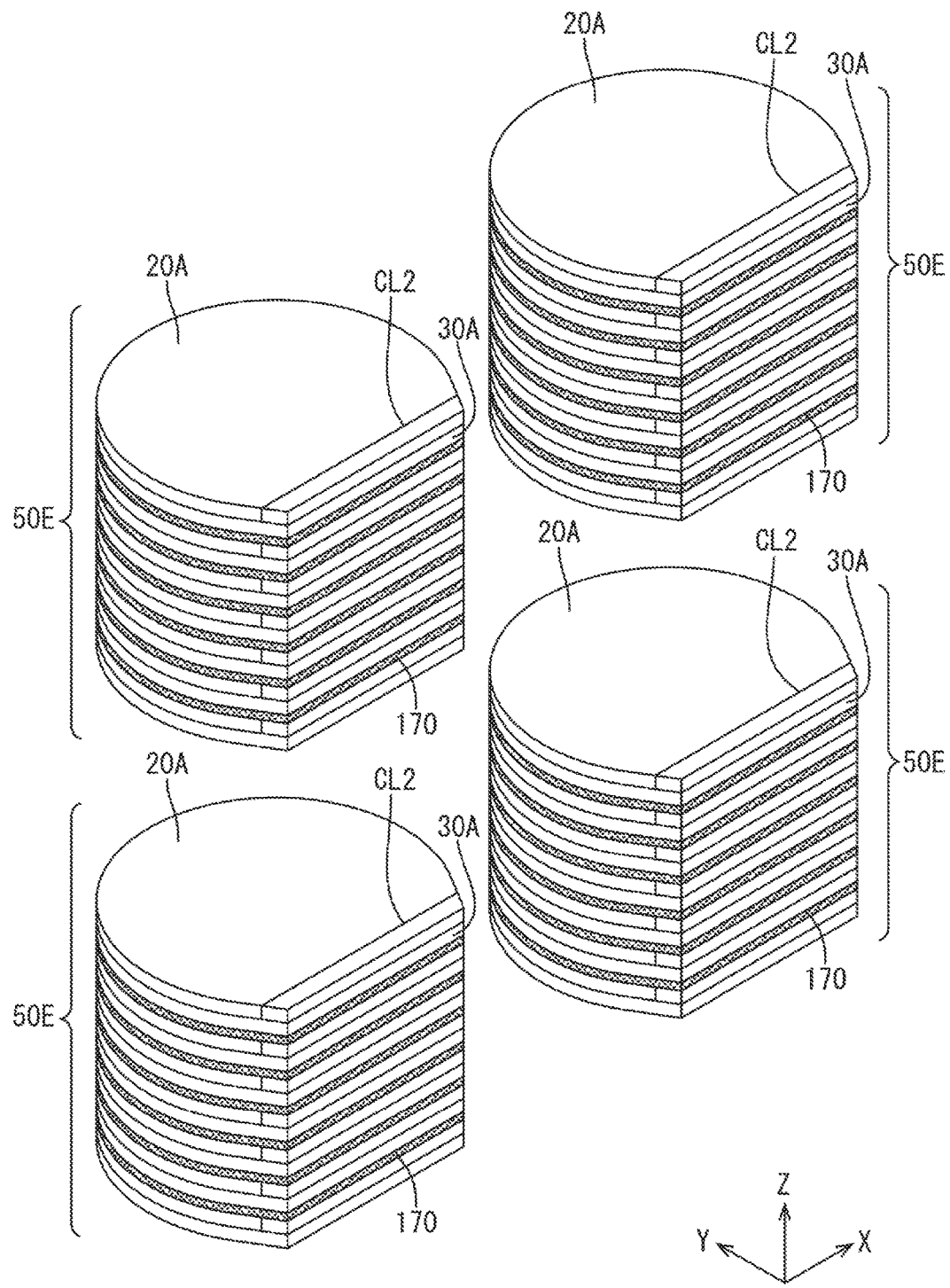
FIG. 12 is a perspective view illustrating a ground layered substrate.

Thereafter, one separated bonded substrate 50C is layered on the layered two (multiple) separated bonded substrates 50C via the curing resin 170 and the positioning operation and curing of the curing resin 170 are performed. This sequence is repeated and five separated bonded substrates 50C are layered via the curing resin 170 (see FIG. 11). In the following, the seven separated bonded substrates 50C that are layered via the curing resin 170 are referred to as a layered substrate 50D. Next, the layered substrate 50D is further cut into multiple pieces for every panel region. In this process, the layered substrate 50D in FIG. 11 is cut along lines defining into panel regions and is cut into four pieces.

Next, each of the four separated layered substrate 50D is subjected to the grinding process. Namely, the curved edge surface of each of the liquid crystal panels 10 to be produced among the edge surfaces of the layered substrate 50D is ground with using the grinder 60. In the grinding process, in the separated bonded substrates 50C included in the layered substrate 50D, portions of the glass substrates 20A, 30A that are outside the thin film patterns and the curing resin 170 between the separated bonded substrates 50C are collectively ground along the outline of each liquid crystal panel 10 to be produced.

In the separated bonded substrates 50C included in the layered substrate 50D, after the grinder 60 is moved and reaches a pair of glass substrates 20A, 30A and the sealing agent portions 40 that are overlapped with each other in a plan view, the pair of glass substrates 20A, 30A, the sealing agent portions 40, and the curing resin 170 are collectively ground along the outline of the curved edge surfaces of the liquid crystal panels 10 to be produced such that grinding surfaces of the glass substrates 20A, 30A and the grinding surfaces of the sealing agent portions 40 are aligned with each other. Hereinafter, the layered substrate 50D after the grinding process is referred to as a ground layered substrate 50E (see FIG. 12).

The layered substrate 50D before being cut into four pieces may be ground along the outline of the curved edge surface of each liquid crystal panel to obtain the ground layered substrates 50E. In such a method, the process of cutting the layered substrate 50D into multiple pieces for each panel region may not be performed. In this process, whether the cutting with a dicing saw is performed or not depends on a total tact time or a total cost for the producing process of the liquid crystal panels 10 and depends on a shape of the liquid crystal panels 10 to be produced.

Next, the ground layered substrate 50E is put in a furnace such as an oven and the ground layered substrate 50E is heated for a predefined time (a separation process). The predefined time for heating the ground layered substrate 50E is within a range from three to sixty minutes. Accordingly, the curing resin 170 included in the ground layered substrate 50E is heated and each of the ground bonded substrates 50B is separated from each curing resin 170 and a clearance is produced therebetween. Therefore, in the ground layered substrate 50E that is taken out of the furnace after being heated for the predefined time, each of the separated bonded substrates 50C can be easily separated from the curing resin 170 (see FIG. 13). Hereinafter, the ground layered substrate 50E is referred to as a separated substrate 50F.

Figure 13:
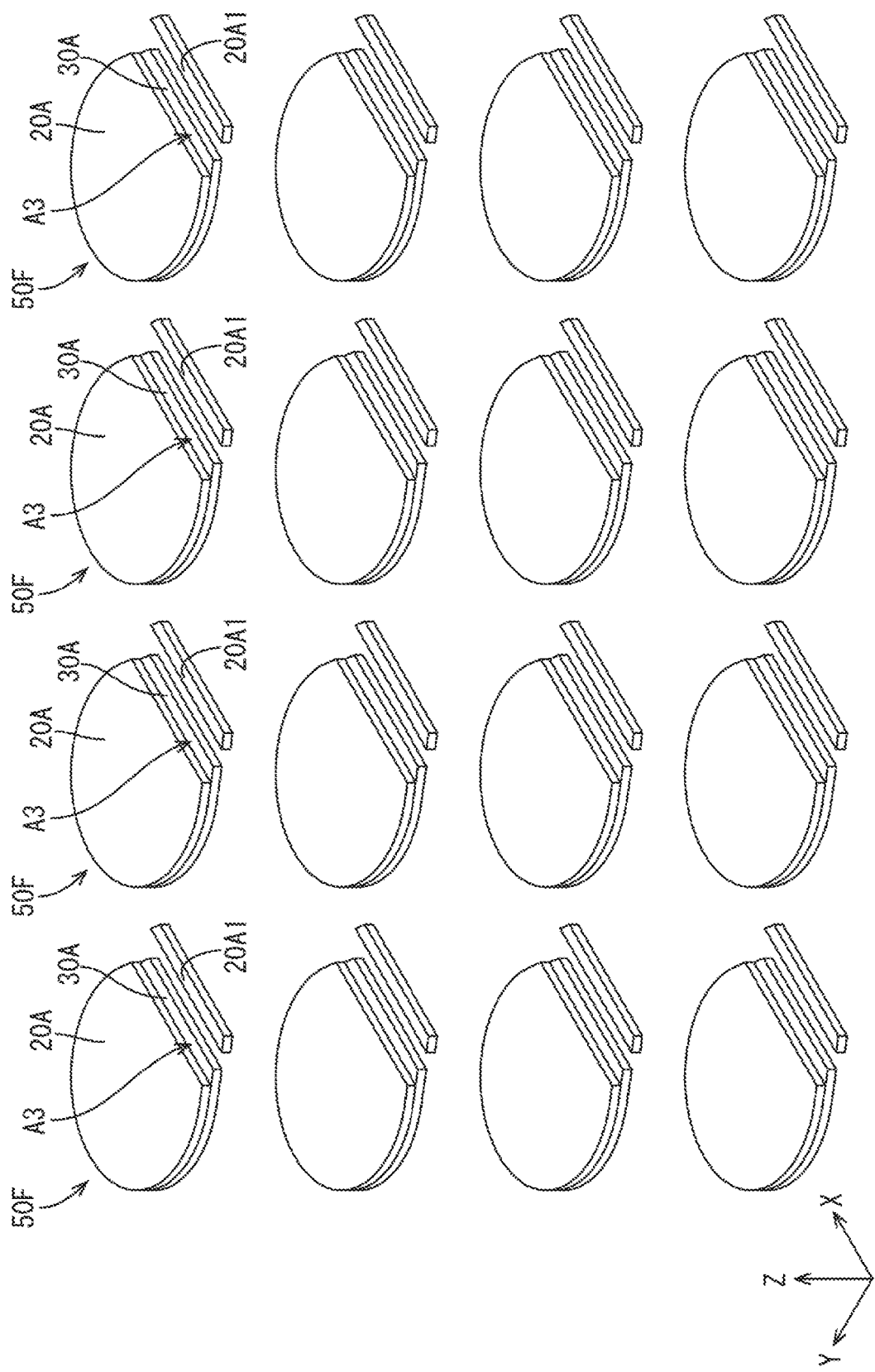
FIG. 13 is a perspective view illustrating a removing process after the separation process.

Thereafter, as illustrated in FIG. 13, the separated substrates 50F that are separated from the curing resin 170 are subjected to the removing process and the edge portion 20A1 of the first glass substrate 20A is removed. Then, the polarizing plates 10C, 10D are bonded to the outer surfaces of the glass substrates 20A, 30A. The IC chip 12 is mounted on each mounting area A3 and the liquid crystal panel of this embodiment is obtained. Seven liquid crystal panels 10 are obtained from each of the four ground layered substrates 50E illustrated in FIG. 12 and twenty eight liquid crystal panels are produced in this embodiment. Sixteen separated substrates 50F are illustrated in FIG. 13.

As described before, according to the producing method of this embodiment, in the grinding process, the layered substrate 50D including the separated bonded substrates 50C that are layered on each other via the curing resin 170 is ground, and in the subsequent separation process, each of the bonded substrates 50C of the layered substrate 50D is separated from the curing resin 170. Therefore, the process of producing the liquid crystal panels is further shortened compared to the method of processing the separated bonded substrates 50C one by one and forming each of the edges of the liquid crystal panels.

The liquid crystal panels 10 produced with the producing method of this embodiment have edge surfaces including a frosted glass surface at a portion subjected to the grinding process and a mirror surface at a portion subjected to cutting with scribing, and a scribing trace remains on the mirror surface. Therefore, the liquid crystal panel 10 produced in the producing method of this embodiment includes an edge surface having different conditions.

Third Embodiment

A third embodiment will be described. In a producing method according to this embodiment, the sequence of the processes included in the producing method of the second embodiment is changed. In the producing method of this embodiment, in the cutting process, the bonded substrate is cut into twenty four pieces for every panel region similarly to the first embodiment. The layering process, the separation process, and the removing process are sequentially performed for each of the separated bonded substrates for every panel region. Accordingly, the layered substrate is not necessary to be cut and a large-sized dicing saw for cutting the layered substrate is not necessary to be prepared and a producing cost is reduced.

Modifications of each of the above embodiments will be described below.

(1) In each of the above embodiments, the layered substrate is subjected to the grinding process using the grinder in the grinding process. However, the method and the device of performing the grinding process may not be limited thereto.

(2) In each of the above embodiments, the method of producing the liquid crystal panels included in the liquid crystal display device is described. However, a type of the display device including the display panel produced with the producing method of the present invention is not limited. For example, the producing method of producing an organic EL panel included in an organic EL display device is also included in the scope of the present invention.

The present invention is not limited to the embodiments, which have been described using the foregoing descriptions and the drawings. The embodiments described above are also included in the technical scope of the present invention.

EXPLANATION OF SYMBOLS

10: liquid crystal panel, 12: IC chip, 14: flexible printed circuit board, 18: liquid crystal layer, 20: color filter substrate, 20A: first glass substrate, 20A1: edge portion (of the first glass substrate), 20L: CF layer, 22: color filter, 24: counter electrode, 30: array substrate, 30A: second glass substrate, 30L: TFT layer, 32: TFT, 34: pixel electrode, 40: sealing agent portion, 50: bonded substrate, 50A, 50C: separated bonded substrate, 50B: ground bonded substrate, 50D: layered substrate, 50E: ground layered substrate, 50F: separated substrate, 60: grinder, 170: curing resin, A1: display area, A2: non-display area, A3: mounting area, AM1: alignment mark, CL1, CL2: cut line, P1, P2, P3, P4: intersection point, SL1: cutting line

The invention claimed is:

1. A method of producing display panels, each display panel including an outline portion which is curved, and a mounting area in a portion of a panel surface area thereof, the mounting area in which a driving component that drives the display panel is mounted, the method comprising:

a bonding process of bonding a first substrate and a second substrate that includes thin film patterns, and forming a bonded substrate that includes the first substrate and the second substrate;

a cut forming process of forming a cut line on a border portion between the mounting area within the panel surface area and another area on the first substrate of the bonded substrate, the cut forming process being performed after the bonding process;

a layering process of layering the bonded substrate on another bonded substrate via curing resin, curing the curing resin, and forming a layered substrate that includes the bonded substrate, the another bonded substrate, and the curing resin therebetween, the layering process being performed after the cut forming process;

a cutting process of cutting the bonded substrate into separated bonded substrate pieces after the cut forming process;

a grinding process of grinding the first substrate and the second substrate included in each of the separated bonded substrate pieces at a position outside the thin film patterns and along the outline, and forming edge surfaces of the display panels each having the curved outline, the grinding process being performed after the cutting process;

a separation process of separating each of the bonded substrate and the other bonded substrate included in each of the separated layered substrate pieces from the curing resin, the separation process being performed after the grinding process; and a removing process of cutting a cut portion of the one substrate along the cut line and removing the cut portion, wherein in the cutting process, the layered substrate is cut into separated layered substrate pieces, and in the grinding process, the first substrate, the second substrate, and the curing resin that are included in each of the separated layered substrate pieces are ground collectively at a position outside the thin film patterns along the outline.

2. The method of producing the display panels according to claim 1, wherein, in the cut forming process, the cut line is formed to extend to an edge surface of the first substrate.

* * * * *